US008482070B1

(12) United States Patent
Flatresse et al.

(10) Patent No.: US 8,482,070 B1
(45) Date of Patent: Jul. 9, 2013

(54) SILICON-ON-INSULATOR CMOS INTEGRATED CIRCUIT WITH MULTIPLE THRESHOLD VOLTAGES AND A METHOD FOR DESIGNING THE SAME

(75) Inventors: Philippe Flatresse, Lapierre (FR);
Bastien Giraud, Grenoble (FR);
Jean-Philippe Noel, Montbonnot Saint Martin (FR); Matthieu Le Boulaire, Saint Martin le Vinoux (FR)

(73) Assignee: STMicroelectronics (Crolles 2), Crolles (FR)

( * ) Notice: Subject to any disclaimer, the term of this patent is extended or adjusted under 35 U.S.C. 154(b) by 0 days.

(21) Appl. No.: 13/564,407

(22) Filed: Aug. 1, 2012

(51) Int. Cl.
*H01L 27/092* (2006.01)
*H01L 21/762* (2006.01)
*H01L 21/8228* (2006.01)
*H01L 21/8238* (2006.01)

(52) U.S. Cl.
USPC ............ 257/351; 257/E27.062; 257/E27.064; 257/E21.561; 257/E21.611; 257/E21.632; 438/154; 438/199

(58) Field of Classification Search
USPC ........... 257/351, E27.062, E27.064, E21.611, 257/E21.632, E21.561; 438/154, 199
See application file for complete search history.

(56) References Cited

U.S. PATENT DOCUMENTS 8,421,156 B2 * 4/2013 Cheng et al. ................. 257/366
2011/0317486 A1 * 12/2011 Lu et al. ....................... 365/182

OTHER PUBLICATIONS

J.P. Noel et al., "A Simple and Efficient Concept for Setting up Multi-$V_T$ Devices in Thin Box Fully-Depleted SOI Technology", ESSDERC/ESSCIRC 2009, Sep. 2009.
C.Fenouillet-Beranger et al., "Efficient Multi-VT FDSOI technology with UTBOX for low power circuit design," 2010 Symposium on VLSI Technology Digest of Technical Papers, IEEE 2010, pp. 65-66.
Jean-Philippe Noel et al., "Multi-$VT$ UTBB FDSOI Device Architectures for Low-Power CMOS Circuit," 2011 IEEE Transactions on Electron Devices.

* cited by examiner

*Primary Examiner* — Victor A Mandala
(74) *Attorney, Agent, or Firm* — Occhiuti Rohlicek & Tsao LLP (57) ABSTRACT

An IC has cells placed in a cell row having a UTBOX-FDSOI pMOSFET including a ground beneath the pMOS, and an n-doped well beneath it and configured to apply a potential thereto, and a UTBOX-FDSOI nMOSFET including a ground beneath the nMOS, and a p-doped well beneath the ground and configured to apply a potential thereto, and cells, each including a UTBOX-FDSOI pMOSFET including a ground beneath the pMOS, and a p-doped well beneath the ground and configured to apply an electrical potential to the ground, and a UTBOX-FDSOI nMOSFET including a ground beneath the nMOS, and an n-doped well beneath the ground and configured to apply a potential thereto. The cells are placed so that pMOS's of standard cells belonging to a row align along it and a transition cell including a another well and contiguous with first row standard cells thus ensuring continuity with wells of those cells.

10 Claims, 3 Drawing Sheets

SILICON-ON-INSULATOR CMOS INTEGRATED CIRCUIT WITH MULTIPLE THRESHOLD VOLTAGES AND A METHOD FOR DESIGNING THE SAME

FIELD OF INVENTION

The present invention relates to semiconductor integrated circuits and, more specifically, integrated circuits manufactured on a SOI (Silicon on Insulator) substrate.

BACKGROUND

In SOI technology, a thin layer of silicon (typically featuring a thickness of a few nanometers) is separated from a semiconductor substrate by a relatively thick electrically insulating layer (typically featuring a thickness of a few tens of nanometers).

Integrated circuits in SOI technology offer a number of advantages compared to traditional "bulk" technology for CMOS (Complementary Metal Oxide Semiconductor) integrated circuits. SOI integrated circuits typically provide a lower power consumption for a same performance level. Such circuits also feature a reduced stray capacitance, allowing an increase of commutation speeds. Furthermore, the latch-up phenomena encountered in bulk technology can be mitigated. Such circuits are therefore particularly adapted to SoC (System on Chip) or MEMS (Micro electro-mechanical systems) applications. SOI circuits also are less sensitive to ionizing radiations, making them more reliable than bulk-technology circuits in applications where said radiations may induce operating problems, such as aerospace applications. SOI integrated circuits can include memory components such as SRAM (Static Random Access Memory), or logic gates.

Much research has been conducted on reducing the static power consumption of logic gates, while increasing their commutation speed. Some integrated circuits combine both logic gates with low power consumption, and logic gates with high commutation speed. In order to integrate two such logic gates on a same integrated circuit, it is known to lower the threshold voltage (typically noted $V_T$ or $V_{th}$) of some transistors belonging to the high-speed logic gates, and to lower the threshold voltage of some other transistors of the low-consumption logic gates. In bulk technology, threshold voltage modulation is implemented by differentiating the doping level of the semiconductor canal of these transistors. However, FDSOI (Fully Depleted Silicon On Insulator) transistors have, by design, a depleted canal, featuring a low doping level (typically $10^{15}$ cm$^{-3}$). Due to this low doping level, it is not possible to modulate the threshold voltage of transistors with the method used in bulk technology. Some studies have proposed integrating different gate materials in otherwise identical transistors, in order to obtain differing threshold voltages. However, implementing this solution is technically challenging and economically prohibitive.

In order to obtain different threshold voltages for transistors in FDSOI technology, it is also known to include an electrically biased ground plane (also named back plane, or back gate), located between a thin electrically insulating oxide layer, and the silicon substrate. This technology is often known as UTBOX (for Ultra-Thin Buried OXide layer). By adjusting the doping levels of, and the electrical bias applied to these ground planes, it is therefore possible to define several ranges of threshold voltages for said transistors. For example, it is possible to define low-threshold voltage transistors (LVT), high-threshold voltage transistors (HVT) and medium or standard threshold voltage transistors (SVT).

Some publications have proposed modifying the structure of FDSOI integrated circuits. A practical problem, as with any such technological evolution, is that the software used to design said circuits may end up being incompatible with the modified circuits and may require substantive development.

As large-scale integrated circuits have become too complex to be designed by hand, circuit designers typically rely on computer-assisted design (CAD) software tools, also known as electronic design automation (EDA). For current technology nodes, numerous parameters must be taken into account in order to avoid a malfunction or a destruction of the circuits.

Many EDA tools use a functional specification as input. This functional specification describes the desired behaviour of the circuit, as well as non-functional design constraints (such as, for example, circuit surface, cost, and power consumption). ESD tools output a computer file describing a circuit at a physical level (usually in the GDSII file format or, more recently, the OASIS file format). This computer file defines layouts used to manufacture masks. Such masks are then used in semiconductor foundries, during photolithography steps of the integrated circuit fabrication process.

Standard EDA design flow typically comprises several steps.

First, starting with a user-specified functional specification of the circuit, the concept and the global architecture of the circuit is modelled at a high-level of abstraction. The performance of this modelled circuit is then validated. Typically, at this step, the circuit is modelled using a description language such as Verilog, VHDL, SPICE or other.

Then, during floorplanning step, the position of power connections and portions of the circuit is roughly mapped.

Then, a logic synthesis of the circuit is performed. The circuit is modelled at a register-transfer level (RTL). More specifically, the implementation of the circuit is modelled as a combination of several sequential elements as well as logic combinations between the respective inputs and outputs of the sequential elements and the primary inputs and outputs of the integrated circuit. This modelling provides a network, formed essentially of logic gates and hardware registers. This modelling is typically performed using a description language, such as Verilog or VHDL. For example, the RTL modelling is performed using elementary logic circuits (such as AND logic gates, OR logic gates, multiplexers . . . ) and sequential circuits (such as flip-flops . . . ) provided by a standard cell library. At this point of the process, the exact position of each element is not yet specified; the circuit is only represented as a list of elements required to implement the desired circuit functionality.

Then, a high-level synthesis (or algorithmic synthesis) of the circuit behaviour is performed, in order to simulate the time-dependent behaviour of the RTL model.

During a step of logic synthesis, or logic design, the circuit is implemented at a logic gate level, and described by a gate netlist. This gate netlist is generated from the RTL model and from a design library. Such design libraries usually include hundreds of logic circuit elements. Design libraries depend on the technology used for the fabrication process (such as the technology node, foundry-specific design rules . . . ).

The gate netlist outputted by the logic design is generally a computer file describing an instantiation of the logic gates of the circuit as well as their respective interconnections. This gate netlist may be described in a description language such as Verilog, VHDL or EDIF.

The logic design is followed by a step of placement and routing, or place-and-route. During this place-and-route step, the elements of the previously-defined gate netlist are automatically placed and connected, depending on the user specifications.

The logic design of UTBOX FDSOI circuits typically relies on commercially available EDA tools. As it is desirable to minimize the disruption of established EDA design flows and to avoid any extensive rewriting of existing EDA software, some steps of the design process may reuse elements initially defined for bulk technology. For example, the place-and-route step for UTBOX FDSOI circuits often reuses standard cell libraries containing bulk-technology elements. Additional automated transformations must then be performed, after said place-and-route step, in order to obtain a UTBOX FDSOI-compliant circuit layout.

However, said logic design may also be performed using a dedicated standard cell library containing UTBOX FDSOI-specific elements.

UTBOX FDSOI standard cells often include a nMOS transistor and a pMOS transistor, both formed in the thin silicon layer. This thin silicon layer lies onto the buried insulating oxide layer. The thickness of this oxide layer is typically smaller than 50 nanometers. A semiconductor ground plane, or back-gate, is established under each pMOS and nMOS, below the oxide layer. Each of these ground planes is electrically biased through a semiconductor well. The semiconductor well of each pMOS or nMOS transistor lies below the respective semiconductor ground plane belonging to said transistor, under a deep insulation trench. The threshold voltage of the transistors is adjusted by applying, among other parameters, an appropriate voltage on the respective semiconductor wells. In order to increase the possible combinations of threshold voltage ranges, the ground plane may be doped with either p-type or n-type impurities, for either the pMOS or the nMOS transistors.

In a first configuration, the ground planes of pMOS transistors are electrically biased through an n-doped well; the ground planes of nMOS transistors are electrically biased through a p-doped well. This configuration will henceforth be named regular.

Additionally, while the wells of pMOS transistors are usually biased at an electrical potential Vdd and the wells of nMOS transistors are usually biased at an electrical potential GND, said electrical potentials may be modulated in order to adjust the threshold voltages of said transistors. For example, a forward back biasing (FBB) scheme is commonly used. FBB includes applying a GND+$\Delta$V electrical potential on the wells of nMOS transistors, and a Vdd−$\Delta$V electrical potential on the wells of pMOS transistors. The value of $\Delta$V is chosen smaller than Vdd/2, to avoid the formation of an undesirable forward bias between the n-doped and the p-doped wells of the respective pMOS and nMOS transistors. This forward bias would lead to a leakage current between said wells, which would have adverse consequences on the electrical properties of the circuit.

To remove this limitation on the value of $\Delta$V, it is known to switch the doping type of the wells of pMOS and nMOS transistors. In that configuration, henceforth named flipped, pMOS transistors have a p-doped well, and nMOS transistors have a n-doped well. With this configuration, a different biasing scheme can be used.

In order to increase the performance of the circuit and get the benefits of both flipped and regular configurations, it has been proposed to co-integrate regular and flipped standard cells on a same circuit. This co-integration allows multiple ranges of threshold voltage for the transistors of said circuit, thus leading to a better flexibility of operation.

However, circuits comprising both cells of regular and flipped configurations may have electrical and design-related issues. The abrupt discontinuity between the respective n-doped and p-doped wells of two contiguous regular and flipped standard cells gives rise to so-called singularity points, which may not satisfy design rule checking steps of the design process and may cause mask design problems. This discontinuity may also prevent an adequate electrical biasing of the semiconductor wells. These design issues may affect the reliability of the circuit fabrication process.

SUMMARY

Therefore, there is a need for an integrated circuit of UTBOX FDSOI technology with multiple threshold voltage co-integration, featuring an increased level of performance and a more reliable design process.

It is therefore an object of the present invention to provide an integrated circuit, comprising a plurality of cells placed in a first row, said first row including
  a plurality of first cells, each including:
    a first pMOS field effect transistor of UTBOX FDSOI technology, including
      a first semiconductor ground plane, lying beneath the first pMOS transistor;
      a first semiconductor well having a n-type doping, lying beneath the first semiconductor ground plane and able to apply an electrical potential to said first semiconductor ground plane;
    a first nMOS field effect transistor of UTBOX FDSOI technology, including
      a second semiconductor ground plane, lying beneath the first nMOS transistor;
      a second semiconductor well having a p-type doping, lying beneath the second semiconductor ground plane and able to apply an electrical potential to said second semiconductor ground plane;
  a plurality of second cells, each including:
    a second pMOS field effect transistor of UTBOX FDSOI technology, including:
      a third semiconductor ground plane, lying beneath said second pMOS transistor;
      a third semiconductor well having a p-type doping, lying beneath the third semiconductor ground plane and able to apply an electrical potential to said third semiconductor ground plane;
    a second nMOS field effect transistor of UTBOX FDSOI technology, including:
      a fourth semiconductor ground plane, lying beneath the second nMOS transistor;
      a fourth semiconductor well having a n-type doping, lying beneath the fourth semiconductor ground plane and able to apply an electrical potential to said fourth semiconductor ground plane;
  said first and second cells being placed so that the pMOS transistors of said first and second standard cells belonging to said first row are aligned along said first row;
  a first transition cell including a fifth semiconductor well, in which said first transition cell is contiguous to a first and a second standard cells of said first row, so as to ensure electrical continuity with either one or the other of the n-doped first and fourth semiconductor wells or the p-doped second and third semiconductor wells of first and second standard cells.

In a first illustrative embodiment, the circuit contains a second and a third rows, both second and third rows being adjacent to the first row and comprising each a plurality of additional cells, said additional cells being placed adjacent to the contiguous first, second cells and first transition cell of the first row, said plurality of additional cells comprising either:
    first cells but no second cells, or
    second cells but no first cells.

In another illustrative embodiment, said plurality of additional cells is devoid of first transition cells.

In another illustrative embodiment:
    the fifth semiconductor well has a p-type doping;
    the first row includes a n-doped deep semiconductor well lying beneath the first to fifth semiconductor wells, said deep semiconductor well being able to ensure an electrical continuity between the second and third semiconductor wells.

In another illustrative embodiment:
    said circuit includes a p-doped substrate lying beneath the first to fourth semiconductor wells of the respective pMOS and nMOS of the first and second cells;
    the fifth semiconductor well has an n-type doping.

In another illustrative embodiment:
    the circuit includes a p-doped substrate lying beneath the first to fourth semiconductor wells of the respective pMOS and nMOS of the first and second cells;
    the fifth semiconductor well has a p-type doping;
    the circuit includes a second transition cell comprising:
        a sixth semiconductor well, said sixth semiconductor well having a n-type doping;
        an electrical contact for applying an electrical potential to the sixth semiconductor well;
    the first and second transition cells of the first row are:
        each contiguous to a first and a second standard cells belonging to said first row, and
        placed in an alternating pattern along said first row.

In another illustrative embodiment:
    the fifth semiconductor well has a p-type doping;
    the first transition cell includes an electrical contact for applying an electrical potential to the fifth semiconductor well;
    the circuit includes a second transition cell comprising a sixth semiconductor well having an n-type doping;
    the first row includes a n-doped deep semiconductor well lying beneath the first to sixth semiconductor wells, said deep semiconductor well being able to ensure an electrical continuity between the second and third semiconductor wells;
    the first and second transition cells of the first row are:
        each contiguous to a first and a second standard cells belonging to said first row, and
        placed in an alternating pattern along said first row.

In yet another illustrative embodiment, is therefore an object of the present invention to provide a method for generating automatically an integrated circuit layout, comprising steps of:
    automatically placing a plurality of first and second standard cells in a first row of said circuit layout, each of the first standard cells including:
        a first pMOS field effect transistor of UTBOX FDSOI technology, including:
        a first semiconductor ground plane, lying beneath the first pMOS transistor;
        a first semiconductor well having a n-type doping, lying beneath the first semiconductor ground plane and able to apply an electrical potential to said first semiconductor ground plane;
        a first nMOS field effect transistor of UTBOX FDSOI technology, including:
        a second semiconductor ground plane, lying beneath the first nMOS transistor;
        a second semiconductor well having a p-type doping, lying beneath the second semiconductor ground plane and able to apply an electrical potential to said second semiconductor ground plane;
    and each of the second standard cells including:
        a second pMOS field effect transistor of UTBOX FDSOI technology, including:
        a third semiconductor ground plane, lying beneath said second pMOS transistor;
        a third semiconductor well having a p-type doping, lying beneath the third semiconductor ground plane and able to apply an electrical potential to said third semiconductor ground plane;
        a second nMOS field effect transistor of UTBOX FDSOI technology, including:
        a fourth semiconductor ground plane, lying beneath the second nMOS transistor;
        a fourth semiconductor well having a n-type doping, lying beneath the fourth semiconductor ground plane and able to apply an electrical potential to said fourth semiconductor ground plane;
    said first and second standard cells being automatically placed so that the pMOS transistors of said first and second standard cells belonging to said first row are aligned along said first row;
    generating a semiconductor mask layout for the fabrication of a UTBOX FDSOI integrated circuit including said first row;
    wherein placing the first and second cells includes a step of inserting a first transition cell between first and second contiguous standard cells of the first row, so as to ensure electrical continuity with either one or the other of the n-doped first and fourth wells or the p-doped second and third wells of first and second standard cells belonging to said row, each first transition cell including a fifth semiconductor well.

In another illustrative embodiment, the method includes a step of placing a plurality of additional cells into a second and a third rows of the circuit, said second and third rows being adjacent to the first row, said additional cells being placed adjacent to the contiguous first, second cells and first transition cell of the first row, said plurality of additional cells comprising either:
    first cells but no second cells, or
    second cells but no first cells.

In another illustrative embodiment, placing a plurality of second standard cells in the first row includes steps of:
    automatically placing first standard cells in said first row;
    automatically switching the doping type of respective first and second ground planes of some of said first standard cells, in order to obtain second cells.

BRIEF DESCRIPTION OF THE DRAWINGS

The advantage of the present invention will become apparent from the following description of several embodiments with reference to the accompanying drawings, in which.

DETAILED DESCRIPTION

Figure 1:
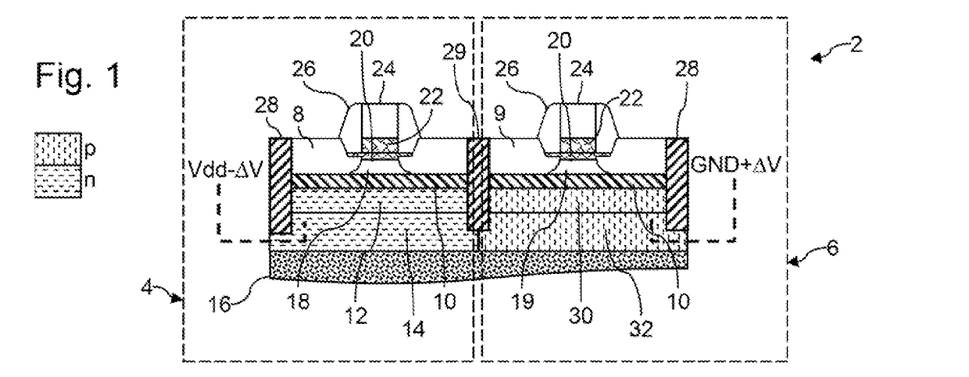
FIG. 1 is a lateral cross-section view of a first standard cell of a UTBOX FDSOI technology integrated circuit.

FIG. 1 shows a first standard cell 2 typically used in SOI (Silicon On Insulator) CMOS integrated circuits. Cell 2 includes a pMOS 4 and a nMOS 6 field effect transistors of FDSOI (Fully Depleted Silicon On Insulator) technology.

Transistor 4 includes:
an active silicon layer 8
an ultra-thin buried oxide (UTBOX) insulator layer 10,
a semiconductor ground plane 12,
a semiconductor well 14,
optionally a semiconductor substrate 16.

The silicon layer 8 includes a source, a canal 18 and a drain. A gate oxide layer 20 covers canal 18. Said layer 20 is covered by a gate stack comprising metal layers 22 and polysilicon layers 24. Said stacks are laterally delimited by spacers 26. Isolation trenches 28, 29 are placed on sides of the transistor 4. The source and drain of layer 8 are doped with a p-type impurity. As known in FDSOI technology, canal 18 has a low doping level so as to be in a depleted state. For example, the doping concentration of canal 18 is lower than $10^{16}$ cm$^{-3}$.

The oxide layer 10 lies below layer 8 and provides electrical insulation between the layer 8 and the substrate 16. In the so-called UTBOX technology, the oxide layer 10 has a reduced thickness. For example, the thickness of the oxide layer 10 is comprised between 10 nm and 100 nm and, preferably, comprised between 10 nm and 50 nm.

The ground plane 12 (also named back plane, or back gate) lies beneath the oxide layer 10, under the layer 8. This ground plane 12 performs an electrical control of the threshold voltage of transistor 4.

The well 14 lies beneath the ground plane 12. This well 14 has an n-type doping. This well 14 is able to electrically bias the ground plane 12 when an electrical potential is applied to the well 14. Here, a control circuit (not shown) is able to bias the well 14 at a first electrical potential.

The transistor 6 is identical to transistor 4, except that:
the layer 8 is replaced by an active silicon layer 9, identical to the layer 8, except that the source and drain of said layer 9 have a n-type doping.
the ground plane 12 is replaced by a semiconductor ground plane 30, and
the well 14 is replaced by a semiconductor well 32.

The ground plane 30 lies beneath the oxide layer 10, under the transistor 6. Ground plane 30 performs an electrical control of the threshold voltage of transistor 6.

The well 32 lies beneath the ground plane 30. This well 32 has a p-type doping. This well 32 is able to electrically bias the ground plane 30 when an electrical potential is applied to the well 32. Here, another control circuit (not shown) is able to bias the well 32 at a second electrical potential.

The doping type of ground planes 12 and 30 can be chosen depending on the desired threshold voltage range of transistors 4 and 6. In this example, transistors 4 and 6 are High Threshold Voltage (HVT) transistors, due to the combined biasing voltage. To this end, the ground planes 12 and 30 have, respectively, an n-type and a p-type doping. For example, said threshold voltage is at least equal to 500 mV and preferably comprised between 500 mV and 650 mV.

In this example, a Forward Back Biasing (FBB) scheme is used. The first electrical potential is chosen equal to Vdd−ΔV, where Vdd is a power supply voltage provided to the cell 2. The second electrical potential is here chosen equal to GND+ΔV, where GND is a ground potential provided to the cell 2. ΔV must be smaller than Vdd/2, to avoid the formation of an undesirable forward-biased diode between the n-doped well 14 and the p-doped well 32. This forward bias would then lead to a leakage current between said wells, which would have adverse consequences on the electrical properties of the circuit.

In this example, the transistors 4 and 6 have a gate length smaller than 100 nm. Here, layers 8, 9 have a thickness at most equal to 50 nm and, preferably, at most equal to 40% of the gate length of, respectively, transistors 4 and 6.

Here, the oxide layer 10 and the insulation trenches 28, 29 are made of silicon oxide ($SiO_2$). The ground planes 12, 30 and the wells 14, 32 have here doping levels comprised between $10^{16}$ and $5*10^{18}$ cm$^{-3}$ and, preferentially, comprised between $5*10^{16}$ and $5*10^{17}$ cm$^{-3}$. The substrate 16 has a p-type doping with a doping level lower than $10^{16}$ cm$^{-3}$ and, preferentially, lower than $5*10^{16}$ cm$^{-3}$.

The wells 14, 32 may extend to a depth of up to 800 nm or 700 nm below the oxide layer 10.

Here, depths and thicknesses are measured along a vertical direction, perpendicular to the oxide layer 10.

Figure 2:
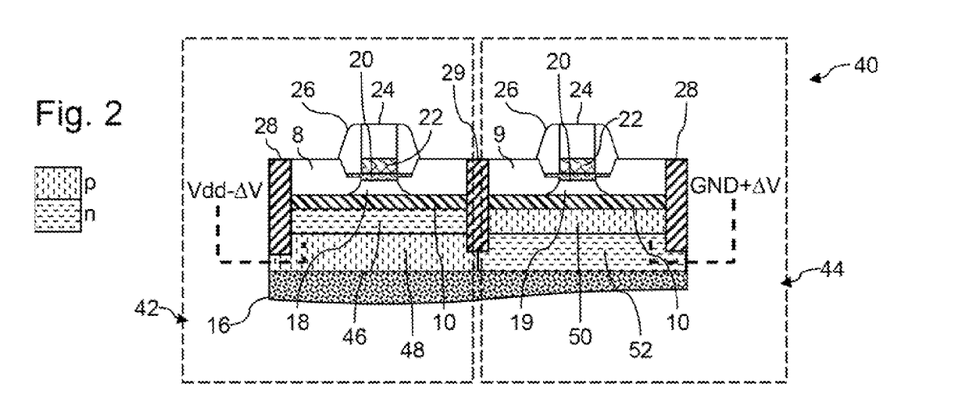
FIG. 2 is a lateral cross-section view of a second standard cell of a UTBOX FDSOI technology integrated circuit.

FIG. 2 shows a second cell 40 (also named flipped cell). This cell 40 includes a second pMOS 42 and a second nMOS 44 field effect transistors.

Transistor 42 is substantially identical to transistor 4, except that:
the ground plane 12 is replaced by a ground plane 46, and
the well 14 is replaced by a semiconductor well 48 having a p-type doping.

Transistor 44 is substantially identical to transistor 6, except that:
the ground plane 30 is replaced by a ground plane 50, and
the well 32 is replaced by a semiconductor well 52 having an n-type doping.

In this example, transistors 42 and 44 are High Threshold Voltage (HVT) transistors, due to the combined biasing voltage. For example, said threshold voltage at least equal to 500 mV. To this end, the ground planes 46 and 50 have, respectively, an n-type and a p-type doping.

By replacing wells 14 and 32 with wells 48 and 52 of opposite doping types, it is possible to use for the cell 40 a different biasing scheme. Here, the ground plane 46 is biased, through the well 48, at the potential Vdd−ΔV; the ground plane 48 is biased, through the well 50, at the potential GND+ΔV. Thus, a FBB scheme is applied on ground planes 46 and 48. The value of ΔV may be increased up to Vdd in the flipped configuration, without the formation of an undesirable forward bias between wells 48 and 52.

Co-integrating cells 2 and 40 into a single block of a same integrated circuit allows benefiting from the advantages of both respective biasing schemes. It can, however, lead to significant design problems.

Figure 3:
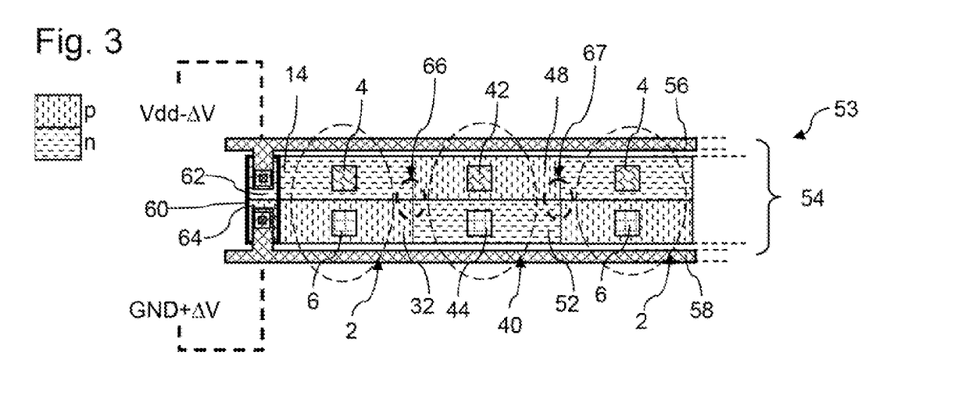
FIG. 3 is a simplified view from above of a portion of an integrated circuit of UTBOX FDSOI technology according to a usually automatically rejected design, comprising the first and second standard cells of FIGS. 1 and 2 placed into a first row.

An example of such design problems is illustrated on FIG. 3. FIG. 3 shows a top view of a portion of an exemplar integrated circuit 53 that may be designed but would not be compliant with commonly used automatic design checking rules. This circuit 53 comprises a first row 54 including a plurality of standard cells. The first row 54 includes alternating cells 2 and 40, co-integrated side by side into a single block.

To simplify the drawings, the doping type of the wells of cells 2, 40 is made visible and details of the transistors 4, 6, 42 and 44 are omitted, such as the insulation trenches 28 and 29. For the same reasons, only three cells 2 and/or 40 are drawn, although row 54 can include more than three cells 2 and/or 40.

Cells 2 and 40 are placed so that all pMOS transistors 4, 42 are aligned along a first direction parallel to row 54 and, all nMOS transistors 6, 44 are aligned along a second direction parallel to row 54. This configuration allows the biasing of ground planes of cells 2, 40 by, respectively, power supply rails 56 and 58. To this end, row 54 also includes a well tap cell 60. This cell 60 includes a n-type 62 and a p-type 64 doped wells for applying an electrical bias to the p-doped and n-doped semiconductor wells of row 54.

However, in this example, the arrangement of the cells 2 and 40 in row 54 leads to a discontinuity between the wells 14, 32, 48 and 52, placed here in a checkerboard pattern. This disposition also gives rise to so-called singularity points 66, 67, contiguous to the wells 14, 32, 48 and 52. The singularity points 66, 67 may cause numerous design issues and are not compliant with usual design checking rules. Furthermore, due to discontinuities between the n-doped wells 14 and 52, and the p-doped wells 32 and 48, the wells 32 and 52 within row 54 cannot be biased by the cell 60.

Figure 4:
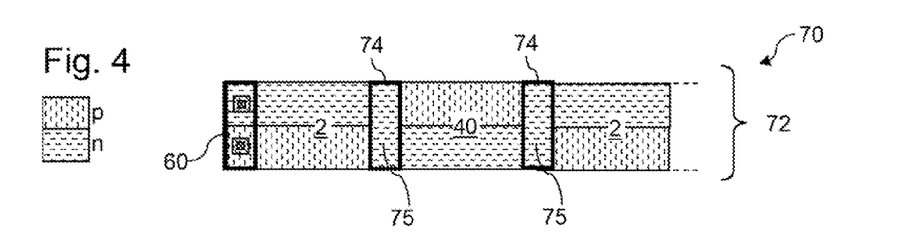
FIG. 4 is a simplified top view of a portion of an integrated circuit of UTBOX FDSOI technology, comprising first transition cells and the first and second standard cells of FIGS. 1 and 2 placed into a first row.

FIG. 4 illustrates an example of an integrated circuit in which such discontinuities and singular points may be avoided. FIG. 4 shows a portion of an integrated circuit 70 including a row 72 containing a plurality of cells. On this figure, rails 56 and 58 are not drawn.

This row 72 is identical to row 54, except that it also includes at least a first kind of transition cell 74. Each cell 74 is placed contiguously to both a cell 2 and a cell 40, at each interface between a cell 2 and a cell 40 belonging to row 72. Each cell 74 includes a doped semiconductor well 75.

By placing a cell 74 at each interface between cells 2 and 40, the singularity points 66, 67 can be removed. The electrical continuities between p-doped wells and n-doped wells of the row 54 can also be maintained. In this example, the well 75 has an n-type doping. For example, the depth and the doping level of well 75 are essentially identical to the respective depth and doping level of wells 14 and/or 52. Thus, the electrical continuity between the n-doped wells 14 and 52 of, respectively, cells 2 and 40 is maintained through said cells 74. The electrical continuity between the p-doped wells 32 and 48 is maintained through the p-doped substrate 16. Thus, the respective semiconductor wells of cells 2 and 40 of row 72 can be electrically biased by cell 60.

Figure 5:
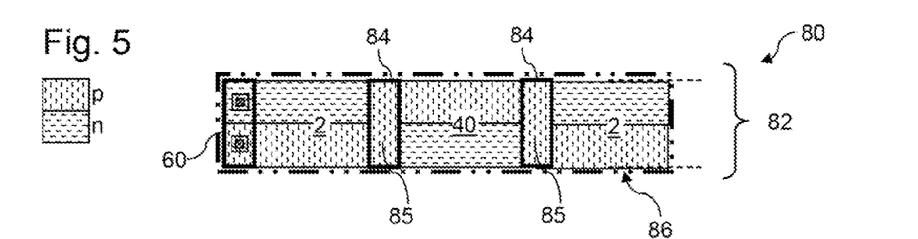
FIG. 5 is a simplified top view of another embodiment of the circuit of FIG. 4.

FIG. 5 illustrates another embodiment of the circuit 70. FIG. 5 shows a portion of an integrated circuit 80, including a row 82 containing a plurality of cells. This row 82 is substantially identical to row 72, except that:

cells 74 are replaced by a second kind of transition cell 84, row 82 further includes a n-doped deep well 86.

Cells 84 are identical to cells 74, except that the well 75 is replaced by a well 85 having a p-type doping instead of an n-type doping, so as to ensure electrical continuity with contiguous p-doped wells 32 and 48.

The deep well 86 lies beneath wells 14, 32, 48, 52 and 85.

The electrical continuity between the p-doped wells 32 and 48 of, respectively, cells 2 and 40 is maintained through said cells 84. The electrical continuity between the n-doped wells 14 and 32 is maintained through this n-doped well 86. Thus, the respective semiconductor wells of cells 2 and 40 of row 82 can be electrically biased by cell 60.

Figure 6:
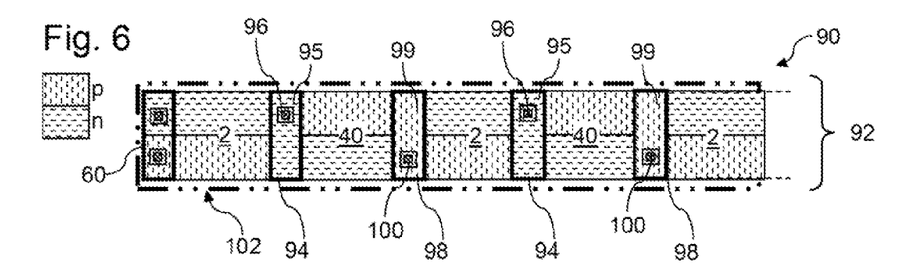
FIG. 6 is a simplified top view of another embodiment of the circuit of FIG. 4.

FIG. 6 illustrates another embodiment of the circuits 70 and 80. FIG. 6 shows a portion of an integrated circuit 90, including a row 92 containing a plurality of cells. Row 92 is substantially identical to row 72, except that cells 74 are replaced by first kind 94 and second kind 96 transition cells. For clarity, additional cells 2 and 40 have been drawn. Cells 94 and 96 are placed alternatively at interfaces between contiguous cells 2 and 40. Thus, any cell 40, or any plurality of contiguous cells 40, is itself contiguous to one cell 94 and one cell 96.

Cell 94 includes a semiconductor well 95 and an electrical contact 96 able to apply an electrical bias on well 95. Cell 98 includes a semiconductor well 99 and an electrical contact 100 able to apply an electrical bias on well 99.

Here, the wells 95 and 99 are identical, respectively, to wells 75 and 85.

Thus, the semiconductor wells of cells 2 and 40 can be electrically biased by cell 60.

Optionally, row 92 may include a n-doped deep semiconductor well 102 substantially identical to well 86, said well 102 lying below wells 14, 32, 48, 52, 95 and 99.

The electrical potentials applied to the electrical contacts of well tap cell 60 are applied to the contacts 96 and 100. Thus, all the wells of row 92 can be electrically biased, regardless of the presence of the p-doped substrate 16 or the deep well 102.

Figure 7:
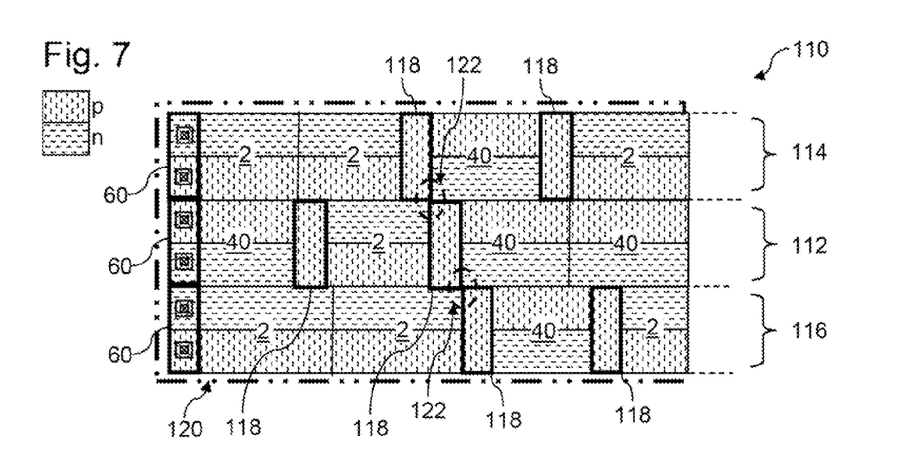
FIG. 7 is a simplified top view of another embodiment of the circuit of FIG. 4.

Integrated circuits may include a plurality of rows including cells 2 and 40. In some specific cases, singularity points analogous to points 66, 67 may appear between adjacent rows, depending on the specific arrangement of said rows, as illustrated in FIG. 7. Such cells arrangements would not be compliant with commonly used design checking rules. For example, such arrangements would be rejected during CAD-to-mask steps of the design process. FIG. 7 shows a portion of an integrated circuit 110, comprising first 112, second 114 and third 116 rows. Rows 114 and 116 are adjacent to row 112.

In this example, rows 112, 114, 116 include a plurality of cells 2, 4, 60 and transition cells 118. In each row 112, 114 and 116, cells 2 and 40 are placed so that all pMOS transistors 4, 42 are aligned along a direction parallel to rows 112, 114 and 116. The circuit 110 also includes an n-doped deep well 120, substantially identical to well 102.

Each cell 118 is placed contiguously to both cells 2 and 40, at each interface between a cell 2 and a cell 40 that belongs to a same row 112, 114 or 116. Cells 118 are here identical to cells 84 and have the same function as cells 84. Cells 118 include here a p-doped well able to ensure an electrical continuity between the p-doped wells of cells 2 and 40 within each row 112, 114 and 116. The electrical continuity between the n-doped wells 32 and 48 is maintained through the deep well 120.

However, in some cases, singularity points 122 may appear between adjacent rows. In this example, singularity points 122 are present between cells 2, 40 and 118 of adjacent rows 112 and 114 and of adjacent rows 112 and 116.

Figure 8:
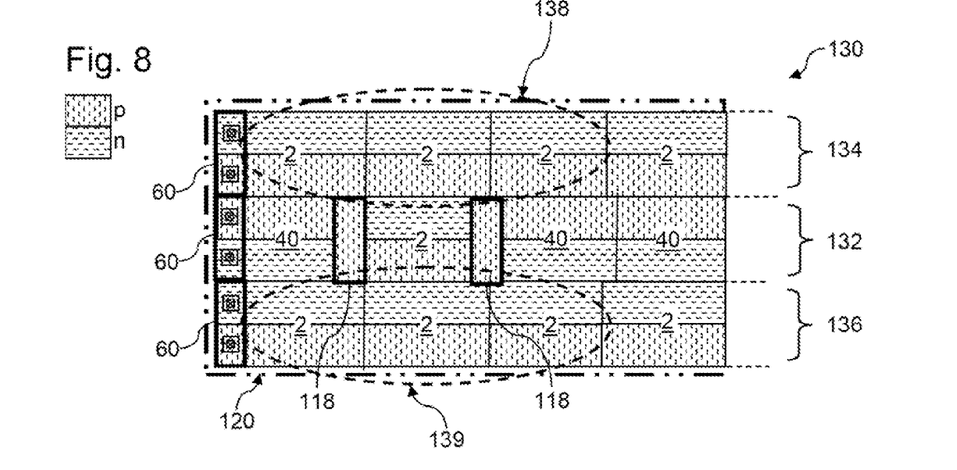
FIG. 8 is a simplified top view of another embodiment of the circuit of FIG. 4.

FIG. 8 illustrates an example of a circuit in which points 122 may be avoided. FIG. 8 shows a portion of an integrated circuit 130 including a plurality of parallel rows 132, 134 and 136, each comprising a plurality of cells. Rows 134 and 136 are adjacent to row 132.

Row 132 is identical to row 112.

Rows 134, 136 are, respectively, substantially identical to rows 114 and 116, except that they do not include both cells 2 and 40, at least in regions 138, 139. These regions 138, 139 are adjacent to regions of the row 132 containing contiguous cells 2, 40 and 118. For example, in each region 138, 139, the rows 134 or 136 contain cells 2 but no cells 40, or cells 40 but no cells 2.

Additionally, rows 134, 136 may also be devoid of transition cells 118 in regions 138, 139.

In this example, rows 134 and 136 comprise cells 2 but no cells 40.

The occurrence of singularity points 120 between adjacent rows can thus be mitigated, by limiting the co-integration of cells 2 and 40 to only every other row.

Figure 9:
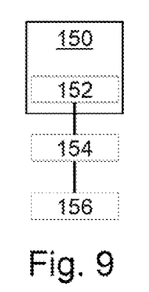
FIG. 9 is a flowchart detailing a method for generating an integrated circuit layout.

A method for generating a layout of circuit 70 will henceforth be described, in reference to the flowchart of FIG. 9 and to the circuit of FIG. 4.

During a step 150, a plurality of standard cells 2, 40 and 60 are automatically placed in row 72. Said cells 2, 40 are placed inside row 72 so that the pMOS transistors of said cells are aligned along said first row. Thus, all pMOS transistors 4, 42 are aligned along a first direction parallel to row 72 and, all nMOS transistors 6, 44 are aligned along a second direction parallel to row 72.

For example, during a sub-step 152 of step 150, some cells 2 are flipped, so as to obtain cells 40. For example, said flipping may include automatically switching the doping type of the ground planes 12, 30.

During a step 154, transition cells 74 are automatically placed in row 72 at every interface between contiguous cells 2 and 40, to separate said contiguous cells 2 and 40 from each other.

During a step 156, a mask layout is automatically generated for the fabrication of circuit 70. For example, this mask layout comprises a plurality of distinct photomasks. Each of said photomasks is able to be used during a specific step of a manufacturing process for the fabrication of circuit 70.

Figure 10:
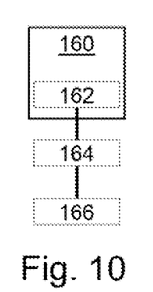
FIG. 10 illustrates a method for generating a layout of the circuit shown in FIG. 5.

FIG. 10 illustrates a method for generating a layout of circuit 80. Said method includes steps 160, 162, 164 and 166 substantially identical, respectively, to steps 150, 152, 154 and 156 except that cells 2, 40 and 74 are replaced, respectively, by cells 3, 41 and 84.

Figure 11:
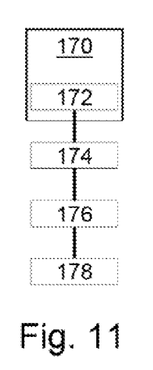
FIG. 11 illustrates a method for generating a layout of the circuit shown in FIG. 6.

FIG. 11 illustrates a method for generating a layout of circuit 90. Said method includes steps 170, 172 and 174, substantially identical, respectively, to steps 160, 162 and 164 except that cells 74 are replaced, respectively, by cells 94 and 98. Said cells 94 and 98 are placed in an alternating pattern.

For example, during step 170, cells 94 are placed into row 92. Then, during a step 171, every other cell 94 is replaced by a cell 98.

Optionally, during a step 176 of routing, electrical interconnections are placed in order to connect the electrical contacts 96 and 100 to electrical contacts of well tap cell 60, so that all n-doped and p-doped wells of row 92 may be biased, respectively, at the first and second electrical potentials.

Then, during a step 178, substantially identical to step 166, a mask layout is automatically generated for the fabrication of circuit 90.

Figure 12:
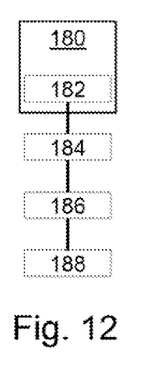
FIG. 12 illustrates a method for generating a layout of the circuit shown in FIG. 8.

FIG. 12 illustrates a method for generating a layout of circuit 130. Said method includes steps 180, 182, 184, substantially identical, respectively, to steps 160, 162, and 164 except that cells 84 are replaced by cells 118.

During a step 186, a plurality of cells 2, 40, are automatically placed into rows 134, 136 adjacent to row 132. Especially, either cells 2 but no cell 40, or cells 40 but no cell 2 are placed in regions 138 and 139 of, respectively, rows 134 and 136.

Then, during a step 188, substantially identical to step 166, a mask layout is automatically generated for the fabrication of circuit 130.

Other embodiments are possible.

The doping type of ground planes 12 and 30, 46 and 50 may be different than the one chosen, depending on the desired threshold voltage ranges for, respectively, transistors 4 and 6, 42 and 44.

The biasing schemes (such as FBB) applied to a cell may be chosen independently of the threshold voltage range of the transistors of said cell.

The deep well 120 may be omitted from row 92.

The pattern in which cells 2, 40 are placed may be different than the one used in the above examples. For example, the respective rows of circuits 53, 70, 80 and 90 are shown having cells 2 and 40 placed in a periodic pattern, but other patterns may be used instead, such as replacing one cell 40 by a plurality of contiguous cells 40. In another example, the rows 134 or 136 may comprise cells 40 instead of cells 2. Row 132 may also comprise a plurality of cells 2 and only one cell 40.

The doping type of wells 95 and 99 may be switched.

The rows may include other types of standard cells not shown here but used in standard design libraries, such as diode protection cells.

Cells 118 of circuits 110 and 130 may be replaced by a cell having a p-doped semiconductor well, such as cell 74. In that case, the deep wells 120 are omitted. Cells 118 may also be replaced by cells 94 and 98 placed in an alternating pattern.

The invention claimed is:

1. An apparatus comprising an integrated circuit, said integrated circuit comprising a plurality of cells placed in a first row, said first row including a plurality of first cells, each including a first pMOS field effect transistor of UTBOX FDSOI technology including a first semiconductor ground plane lying beneath said first pMOS transistor, and a first semiconductor well having n-type doping lying beneath said first semiconductor ground plane and configured to apply an electrical potential to said first semiconductor ground plane, and a first nMOS field effect transistor of UTBOX FDSOI technology including a second semiconductor ground plane lying beneath said first nMOS transistor, and a second semiconductor well having p-type doping lying beneath said second semiconductor ground plane and configured to apply an electrical potential to said second semiconductor ground plane, and a plurality of second cells, each including a second pMOS field effect transistor of UTBOX FDSOI technology including a third semiconductor ground plane lying beneath said second pMOS transistor, and a third semiconductor well having p-type doping lying beneath said third semiconductor ground plane and configured to apply an electrical potential to said third semiconductor ground plane, and a second nMOS field effect transistor of UTBOX FDSOI technology including a fourth semiconductor ground plane lying beneath the second nMOS transistor, and a fourth semiconductor well having n-type doping lying beneath said fourth semiconductor ground plane and configured to apply an electrical potential to said fourth semiconductor ground plane, said first and second cells being placed so that pMOS transistors of first and second standard cells belonging to said first row are aligned along said first row, and a first transition cell including a fifth semiconductor well, wherein said first transition cell is contiguous with first and second standard cells of said first row so as to ensure electrical continuity with either one or the other of the n-doped first and fourth semiconductor wells or the p-doped second and third semiconductor wells of first and second standard cells.

2. The apparatus of claim 1, wherein said integrated circuit contains second and third rows, both second and third rows being adjacent to said first row and each comprising a plurality of additional cells, said additional cells being placed adjacent to said contiguous first and second cells and first transition cell of said first row, said plurality of additional cells comprising at least one of first cells but no second cells, and second cells but no first cells.

3. The apparatus of claim 2, wherein said plurality of additional cells is devoid of first transition cells.

4. The apparatus of claim 1, wherein said fifth semiconductor well has p-type doping, said first row includes an n-doped deep semiconductor well lying beneath said first to fifth semiconductor wells, said deep semiconductor well being configured to ensure electrical continuity between said second and third semiconductor wells.

5. The apparatus of claim 1, wherein said circuit includes a p-doped substrate lying beneath said first to fourth semiconductor wells of said respective pMOS and nMOS of said first and second cells, and wherein said fifth semiconductor well has n-type doping.

6. The apparatus of claim 1, wherein said circuit includes a p-doped substrate lying beneath said first to fourth semiconductor wells of respective pMOS and nMOS of said first and second cells, wherein said fifth semiconductor well has p-type doping, wherein said circuit includes a second transition cell comprising a sixth semiconductor well, said sixth semiconductor well having n-type doping, an electrical contact for applying an electrical potential to said sixth semiconductor well, and wherein said first and second transition cells of said first row are each contiguous with first and second standard cells belonging to said first row, and placed in an alternating pattern along said first row.

7. The apparatus of claim 1, wherein said fifth semiconductor well has p-type doping, wherein said first transition cell includes an electrical contact for applying an electrical potential to said fifth semiconductor well, wherein said circuit includes a second transition cell comprising a sixth semiconductor well having n-type doping, wherein said first row includes an n-doped deep semiconductor well lying beneath said first to sixth semiconductor wells, said deep semiconductor well being configured to ensure electrical continuity between said second and third semiconductor wells, and wherein said first and second transition cells of said first row are each contiguous with first and second standard cells belonging to said first row and placed in an alternating pattern along said first row.

8. A method for automatically generating an integrated circuit layout, said method comprising automatically placing a plurality of first and second standard cells in a first row of said circuit layout, each of said first standard cells including a first pMOS field effect transistor of UTBOX FDSOI technology, including a first semiconductor ground plane lying beneath said first pMOS transistor, a first semiconductor well having n-type doping lying beneath said first semiconductor ground plane and configured to apply an electrical potential to said first semiconductor ground plane, a first nMOS field effect transistor of UTBOX FDSOI technology, including a second semiconductor ground plane lying beneath said first nMOS transistor, a second semiconductor well having p-type doping lying beneath said second semiconductor ground plane and configured to apply an electrical potential to said second semiconductor ground plane, and each of said second standard cells including a second pMOS field effect transistor of UTBOX FDSOI technology, including a third semiconductor ground plane lying beneath said second pMOS transistor, a third semiconductor well having p-type doping lying beneath said third semiconductor ground plane and configured to apply an electrical potential to said third semiconductor ground plane, a second nMOS field effect transistor of UTBOX FDSOI technology, including a fourth semiconductor ground plane lying beneath said second nMOS transistor, a fourth semiconductor well having n-type doping lying beneath said fourth semiconductor ground plane and configured to apply an electrical potential to said fourth semiconductor ground plane, said first and second standard cells being automatically placed so that said pMOS transistors of said first and second standard cells belonging to said first row are aligned along said first row, and generating a semiconductor mask layout for fabrication of a UTBOX FDSOI integrated circuit including said first row, wherein placing said first and second cells includes inserting a first transition cell between first and second contiguous standard cells of said first row so as to ensure electrical continuity with either one or the other of said n-doped first and fourth wells or said p-doped second and third wells of first and second standard cells belonging to said row, each first transition cell including a fifth semiconductor well.

9. The method of claim 8, further comprising placing a plurality of additional cells into second and a third row of said integrated circuit, said second and third rows being adjacent to said first row, said additional cells being placed adjacent to said contiguous first cells, second cells and first transition cell of said first row, said plurality of additional cells comprising one of first cells but no second cells, and second cells but no first cells.

10. The method of claim 8, wherein placing a plurality of second standard cells in said first row comprises automatically placing first standard cells in said first row, and automatically switching doping type of respective first and second ground planes of some of said first standard cells to obtain second cells.

* * * * *